(12) United States Patent
Tanibe et al.

(10) Patent No.: US 11,978,642 B2
(45) Date of Patent: May 7, 2024

(54) METHOD FOR PRODUCING PLASTIC ELEMENT PROVIDED WITH FINE SURFACE ROUGHNESS

(71) Applicant: NALUX CO., LTD., Osaka (JP)

(72) Inventors: Kenji Tanibe, Osaka (JP); Kazuya Yamamoto, Osaka (JP)

(73) Assignee: NALUX CO., LTD., Osaka (JP)

( * ) Notice: Subject to any disclaimer, the term of this patent is extended or adjusted under 35 U.S.C. 154(b) by 327 days.

(21) Appl. No.: 17/486,057

(22) Filed: Sep. 27, 2021

(65) Prior Publication Data
US 2022/0013369 A1 Jan. 13, 2022

Related U.S. Application Data

(63) Continuation of application No. PCT/JP2019/023086, filed on Jun. 11, 2019.

(51) Int. Cl.
*H01L 21/3213* (2006.01)
*B29C 33/42* (2006.01)
(Continued)

(52) U.S. Cl.
CPC ...... *H01L 21/32138* (2013.01); *B29C 33/424* (2013.01); *B29C 59/14* (2013.01);
(Continued)

(58) Field of Classification Search
None
See application file for complete search history.

(56) References Cited

U.S. PATENT DOCUMENTS 6,514,674 B1 2/2003 Iwasaki
2005/0233083 A1 10/2005 Schulz et al.
(Continued)

FOREIGN PATENT DOCUMENTS

DE 102 41 708 A1 3/2004
EP 2 831 648 B1 9/2016
(Continued)

OTHER PUBLICATIONS

International Search Report and Written Opinion dated Sep. 3, 2019 corresponding to International Patent Application No. PCT/JP2019/023086, with partial English translation thereof.

*Primary Examiner* — Jiong-Ping Lu
(74) *Attorney, Agent, or Firm* — SQUIRE PATTON BOGGS (US) LLP

(57) ABSTRACT

A method for producing a plastic element provided with fine surface roughness is provided. In the method, etching of a surface of the plastic element is performed separately in a first step and in a second step, in the first step, fine roughness having a predetermined average value of pitch in the range from 0.05 to 1 micrometer is generated on the surface through reactive ion etching in an atmosphere of a first gas; and in the second step, an average value of depth of the fine roughness generated in the first step is adjusted to a predetermined value in the range from 0.15 to 1.5 micrometers while the predetermined average value of pitch is substantially maintained through reactive ion etching in an atmosphere of a second gas, reactivity to the plastic element of the second gas being lower than reactivity to the plastic element of the first gas.

7 Claims, 11 Drawing Sheets

(51) Int. Cl.
  *B29C 59/14* (2006.01)
  *G02B 1/04* (2006.01)
  *G02B 1/11* (2015.01)
  *G02B 1/118* (2015.01)
  *G02B 1/12* (2006.01)
  *H01J 37/32* (2006.01)
  *H01L 21/3065* (2006.01)

(52) U.S. Cl.
  CPC ............... *G02B 1/04* (2013.01); *G02B 1/11* (2013.01); *G02B 1/118* (2013.01); *G02B 1/12* (2013.01); *H01J 37/32394* (2013.01); *H01L 21/3065* (2013.01); *B29K 2995/0072* (2013.01); *B29K 2995/0093* (2013.01)

(56) References Cited

U.S. PATENT DOCUMENTS

| | | | |
|---|---|---|---|
| 2011/0051246 A1* | 3/2011 | Schulz | G02B 1/111 359/586 |
| 2012/0012557 A1 | 1/2012 | David et al. | |
| 2013/0038949 A1* | 2/2013 | David | B82Y 30/00 428/156 |
| 2014/0374377 A1* | 12/2014 | Schulz | G02B 1/118 216/24 |
| 2015/0077854 A1 | 3/2015 | Yu et al. | |
| 2015/0192702 A1 | 7/2015 | Yamamoto et al. | |
| 2017/0221680 A1 | 8/2017 | Yu et al. | |
| 2018/0088258 A1 | 3/2018 | Yamamoto et al. | |

FOREIGN PATENT DOCUMENTS

| | | |
|---|---|---|
| EP | 3 115 334 A1 | 1/2017 |
| EP | 2 566 681 B1 | 9/2018 |
| JP | 2000-258607 A | 9/2000 |
| JP | 2005-331868 A | 12/2005 |
| JP | 2012-514242 A | 6/2012 |
| JP | 2013-532072 A | 8/2013 |
| JP | 2015-514231 A | 5/2015 |
| JP | 2016-522452 A | 7/2016 |
| WO | WO 2010/078306 A2 | 7/2010 |
| WO | WO 2011/139593 A1 | 11/2011 |
| WO | WO 2013/148031 A1 | 10/2013 |
| WO | WO 2014/076983 A1 | 5/2014 |

* cited by examiner

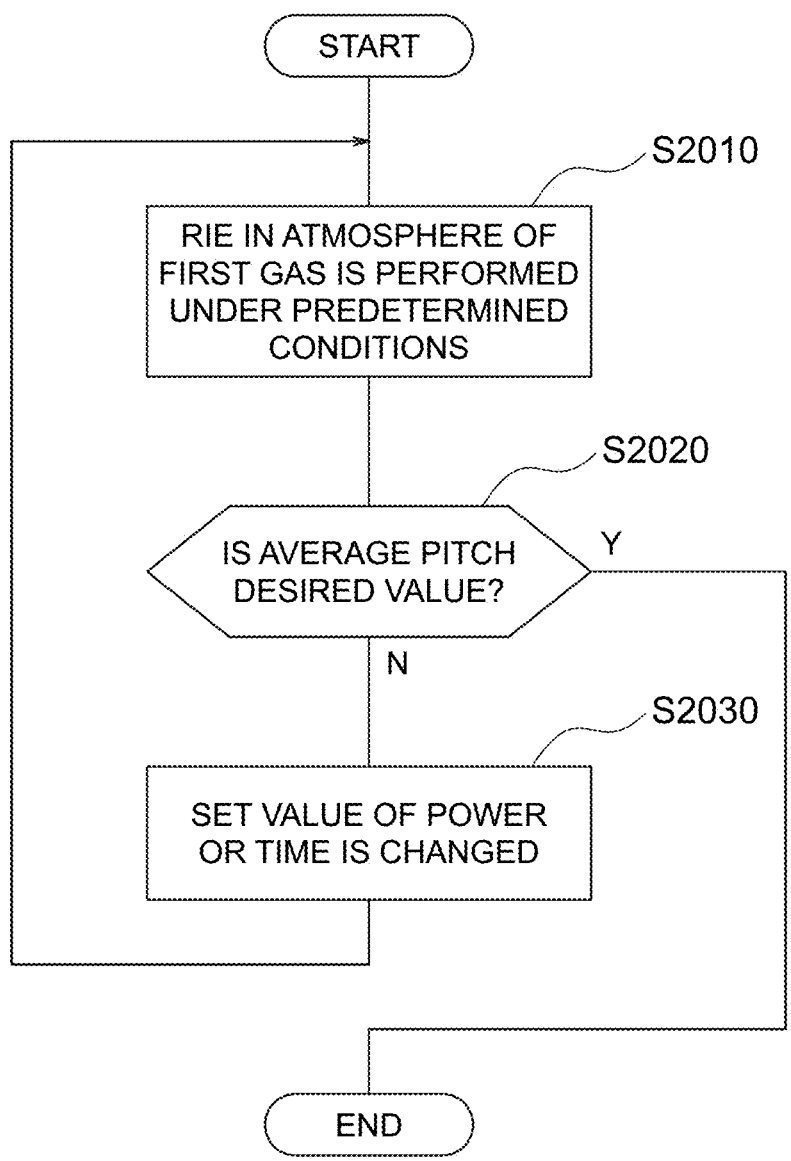

------ NOT PROCESSED ------ CONVENTIONAL METHOD ──── METHOD OF PRESENT INVENTION

------ NOT PROCESSED ------ CONVENTIONAL METHOD ──── METHOD OF PRESENT INVENTION

METHOD FOR PRODUCING PLASTIC ELEMENT PROVIDED WITH FINE SURFACE ROUGHNESS

CROSS REFERENCE TO RELATED APPLICATION

This is a Continuation of International Patent Application No. PCT/JP2019/023086 filed Jun. 11, 2019, which designates the U.S. The content of this application is hereby incorporated by reference.

TECHNICAL FIELD

The present invention relates to a method for producing a plastic element provided with fine surface roughness. Any one of optical elements made of plastics is included in the plastic element. Lenses, diffraction gratings, prisms, micro-lens arrays, diffusers and shielding windows are included in the optical elements.

BACKGROUND ART

An antireflection structure including fine roughness having a pitch (period) equal to or less than wavelength of light is used for optical elements. As a method for producing a mold for such fine roughness, a method in which patterning of resist is performed using an apparatus for interference exposure or an apparatus for electron beam lithography, and then etching or electroforming is performed is known. By such a method, however, fine roughness can hardly be produced on a flat surface or a curved surface with a large area.

Under the circumstances, a method in which a mold provided with fine roughness is produced through a reactive etching process without the necessity of patterning has been developed (for example Patent document 1). According to the method, a mold provided with fine roughness on a flat surface or a curved surface with a large area can be produced without patterning. However, when a plastic element is produced using the mold produced by the above-described method, the shape of the fine roughness of the mold cannot easily be transferred to the plastic element with a high accuracy.

On the other hand, a method in which through a reactive etching process fine roughness is directly produced on a surface of a plastic element such as a lens has been developed (for example Patent document 2). However, a method in which through a reactive etching process, fine roughness having a pitch and a depth that are appropriate for antireflection of visible light, for example is directly produced on a surface of a plastic element has not been established. More specifically, by conventional methods, each of the pitch and the depth of fine roughness generated on a surface of a plastic element can hardly be adjusted to each desired value.

Thus, a method for producing a plastic element provided with fine surface roughness by which through a reactive ion etching process, fine roughness having a desired value of pitch and a desired value of depth can be directly produced on a surface of a plastic element has not been developed.

Under the circumstances, there is a need for a method for producing a plastic element provided with fine surface roughness by which through a reactive ion etching process, fine roughness having a desired value of pitch and a desired value of depth can be directly produced on a surface of a plastic element.

PRIOR ART DOCUMENT

Patent Document

Patent document 1: WO2014076983A1
Patent document 2: DE10241708A1

The object of the present invention is to provide a method for producing a plastic element provided with fine surface roughness by which through reactive ion etching process, fine roughness having a desired value of pitch and a desired value of depth can be directly produced on a surface of a plastic element.

Summary of Invention

A method for producing a plastic element provided with fine surface roughness according to a present invention includes a first step in which fine roughness having a predetermined average value of pitch in the range from 0.05 micrometers to 1 micrometer is generated on a surface of the plastic element through reactive ion etching in an atmosphere of a first gas, and a second step in which an average value of depth of the fine roughness is adjusted to a predetermined value in the range from 0.15 micrometers to 1.5 micrometers while the predetermined average value of pitch is substantially maintained through reactive ion etching in an atmosphere of a second gas, reactivity to the plastic element of the second gas being lower than reactivity to the plastic element of the first gas.

According to the present invention, after the fine roughness having a desired value of the average pitch has been generated in the first step, in the second step the average depth can be adjusted to a desired value while the desired value of the average pitch is substantially maintained in an atmosphere of the second gas, reactivity to the plastic element of the second gas being lower than reactivity to the plastic element of the first gas. Accordingly, fine roughness having a desired value of pitch and a desired value of depth can be directly produced on a surface of the plastic element.

In the method for producing a plastic element provided with fine surface roughness according to a first embodiment of the present invention, the first gas is sulfur hexafluoride ($SF_6$), a mixture of sulfur hexafluoride and at least one of oxygen ($O_2$) and argon (Ar) or oxygen.

In the method for producing a plastic element provided with fine surface roughness according to a second embodiment of the present invention, the gas used in the second step is trifluoromethane ($CHF_3$), a mixture of trifluoromethane and at least one of oxygen ($O_2$) and argon (Ar), carbon tetrafluoride ($CF_4$), or a mixture of carbon tetrafluoride and at least one of oxygen and argon.

The method for producing a plastic element provided with fine surface roughness according to a third embodiment of the present invention further includes a third step in which through plasma processing in an atmosphere of a third gas, fluorinated radicals are made to adhere to the surface of the fine surface roughness while ions are prevented from causing etching.

According to the present embodiment, through plasma processing, a water-repellent finishing of a plastic element provided with fine roughness can be performed. The third step can be performed using an apparatus that is obtained by changing the connection of a high frequency power supply to an electrode in a reactive ion etching apparatus used to perform the first and second steps.

In a method for producing a plastic element provided with fine surface roughness according to a fourth embodiment of the present invention, the third gas is trifluoromethane, carbon tetrafluoride or sulfur hexafluoride.

In a method for producing a plastic element provided with fine surface roughness according to a fifth embodiment of the present invention, the plastic element is an optical element.

In a method for producing a plastic element provided with fine surface roughness according to a sixth embodiment of the present invention, the fine roughness is fine roughness for anti-reflection.

According to the present embodiment, a plastic element provided with fine surface roughness having an average value of pitch and an average value of depth that are appropriate to wavelength of light for which antireflection is required can be produced.

BRIEF DESCRIPTION OF DRAWINGS

FIG. 6 is a flowchart for describing how to determine the etching conditions of the first step;

DESCRIPTION OF EMBODIMENTS

Figure 1:
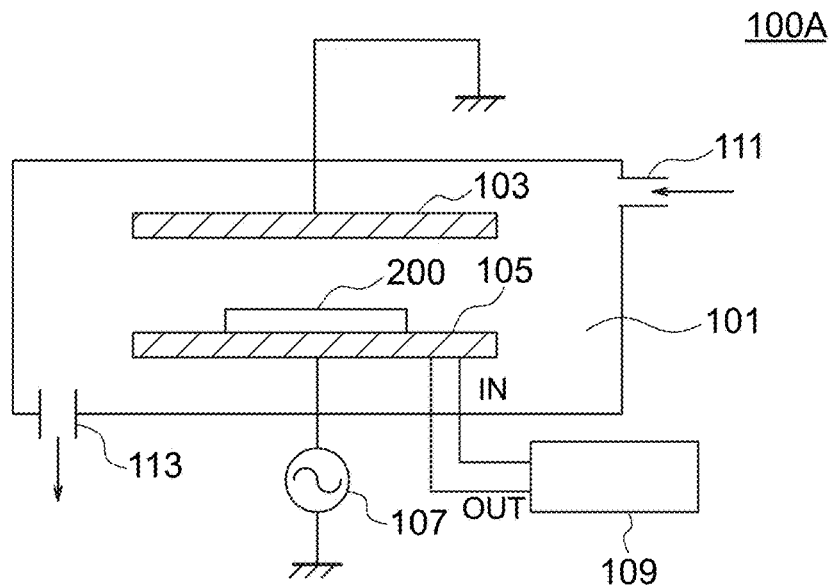
FIG. 1 shows a configuration of a reactive ion etching (RIE) apparatus used for an etching method according to an embodiment of the present invention.

FIG. 1 shows a configuration of a reactive ion etching (RIE) apparatus 100A used for an etching method according to an embodiment of the present invention. The reactive ion etching apparatus 100A includes a reaction chamber 101. Gas is supplied form a gas supply port 111 into the evacuated reaction chamber 101. An amount of gas to be supplied can be adjusted. Further, the reaction chamber 101 is provided with a gas exhaust port 113, which is provided with a valve that is not shown in the drawing. Pressure in the reaction chamber 101 can be kept at a desired value through control of the valve. The reaction chamber 101 is provided with an upper electrode 103, which is grounded and a lower electrode 105, which is connected to a high frequency power supply 107. Plasma can be generated by applying high frequency voltage between the both electrodes using the high-frequency power supply 107. On the lower electrode 105, a plastic element 200 is placed. The plastic element 200 is a plastic lens, for example. The lower electrode 105 can be cooled down to a desired temperature using a coiling device 109. The coiling device 109 is of a water chiller type, for example. The reason why the lower electrode 105 is cooled down is to control etching reaction by keeping the plastic element 200 at a desired temperature.

The reactive ion etching apparatus illustrated in FIG. 1 is that for capacitively coupled etching. An etching apparatus of another type, for example that for inductively coupled etching also can be used.

When high-frequency voltage is applied to the lower electrode 105, on which the plastic element 200 is placed, ions and radicals in the plasma are accelerated toward the plastic element 200 and collide against the plastic element 200. By the collision spattering by the ions and chemical reactions of an etching gas simultaneously occur, and etching is performed. Plastic of the plastic element 200 is formed by a great number of molecular chains, and on the surface of the plastic element 200, portions where density of the molecular chains is relatively high and portions where density of the molecular chains is relatively low are randomly distributed. Since the portions where density of the molecular chains is relatively high are highly resistant to the etching and the portions where density of the molecular chains is relatively low are less resistant to the etching, the etching generates fine surface roughness on the surface of the plastic element 200.

Table 1 shows etching conditions and the average pitch and the average depth of the fine roughness generated by etching under the etching conditions. The plastic element 200 is made of polycarbonate. In Table 1 and the other tables, RF power represents power supplied by the high-frequency power supply 107, processing temperature represents temperature controlled by the coiling device 109 and processing time represents time in which power is supplied for processing.

TABLE 1

|  | Gas pressure | Kind and flow rate of gas | RF power | Processing temperature | Processing time | Average pitch | Average depth |
| --- | --- | --- | --- | --- | --- | --- | --- |
| Conditions 1 | 0.5 Pa | O2:5 ml/min SF6:20 ml/min | 100 W | 30° C. | 300 sec | 0.1 μm | 0.15 μm |
| Conditions 2 | 0.5 Pa | O2:5 ml/min SF6:20 ml/min | 100 W | 30° C. | 800 sec | 0.25 μm | 0.4 μm |

Processing time alone is not identical between the conditions-set 1 and conditions-set 2. In general, the average pitch and the average depth increase with processing time (etching time), and therefore the average pitch and the average depth can be changed in a similar way by changing processing time. As shown in Table 1, each of the average pitch and the average depth obtained under the conditions-set 2 in which processing time is longer is greater than each of the average pitch and the average depth obtained under the conditions-set 1 in which processing time is shorter.

On the other hand, anti-reflection capability of fine roughness is determined by the average value of pitch and the average value of depth, and therefore each of the average pitch and the average depth is required to be set independently to each desired value. However, each of the average pitch and the average depth can hardly be set independently to each desired value by processing time alone. By way of example, the depth of the surface roughness obtained by the etching under the conditions-set 1 is too small to obtain a desired anti-reflection capability for visible light as described later. The depth of the fine roughness obtained by the etching under the conditions-set 2 is appropriate to the desired anti-reflection capability for visible light, but the average pitch is too great, and therefore reflection of visible light having various wavelengths causes cloudiness.

The average pitch and the average depth can be changed also by power supplied by the high-frequency power supply 107. In this case also, the average pitch and the average depth increase in a similar way with power, and therefore each of the average pitch and the average depth can hardly be set independently to each desired value.

Figure 2:
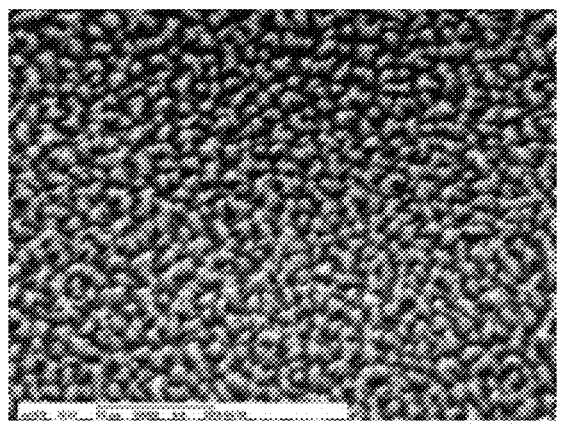
FIG. 2 is a SEM (Scanning Electron Microscope) image of the fine roughness obtained under the conditions-set 1.

FIG. 2 is a SEM (Scanning Electron Microscope) image of the fine roughness obtained under the conditions-set 1.

Figure 3:
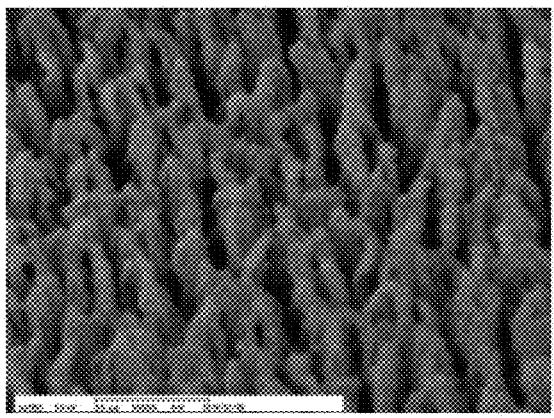
FIG. 3 is a SEM (Scanning Electron Microscope) image of the fine roughness obtained under the conditions-set 2.

FIG. 3 is a SEM (Scanning Electron Microscope) image of the fine roughness obtained under the conditions-set 2.

By observing the process in which a fine structure is formed, the inventors have found that in an earlier stage fine structure having a relatively small pitch and a relatively small depth is formed, and in a later stage both the pitch and the depth increase with time. The inventors have divided the process into a first step that is the earlier stage and a second step that is the later stage and have tried to restrict development of etching in the second step. As a result of the trials, the inventors have obtained new information that when in the second step an atmosphere gas reactivity of which is lower than reactivity of the atmosphere gas used in the first step is used, the depth alone can be increased while the pitch is kept unchanged in the second step. In other words, it has been found that when etching is performed in two separate steps that are the first step and the second step and in the second step an atmosphere gas reactivity of which is lower than reactivity of the atmosphere gas used in the first step is used, each of the pitch and the depth of fine roughness can be set independently to each desired value.

Figure 4:
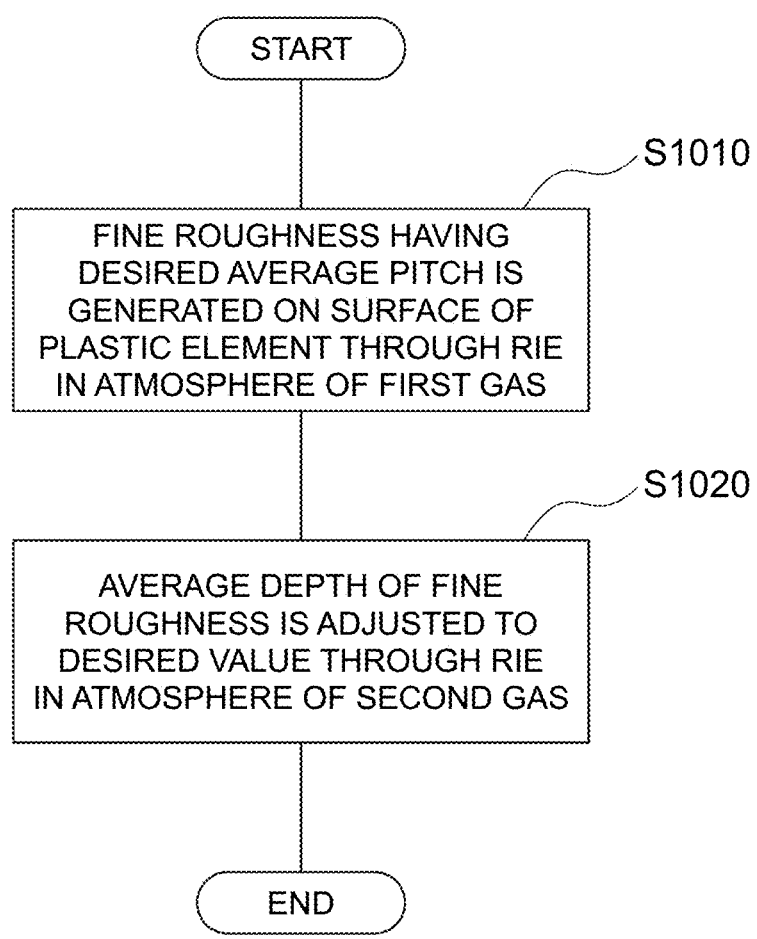
FIG. 4 is a flowchart for describing an etching method according to an embodiment of the present invention.

FIG. 4 is a flowchart for describing an etching method according to an embodiment of the present invention.

Figure 5A:
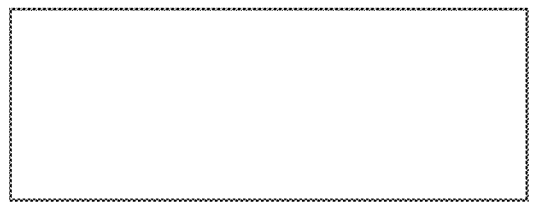
FIG. 5A is a drawing illustrating the etching method according to the embodiment of the present invention.
Figure 5B:
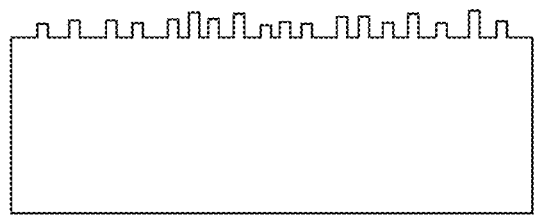
FIG. 5B is a drawing illustrating the etching method according to the embodiment of the present invention.
Figure 5C:
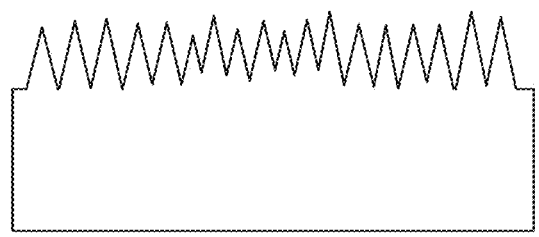
FIG. 5C is a drawing illustrating the etching method according to the embodiment of the present invention.

FIG. 5A-FIG. 5C are drawings illustrating the etching method according to the embodiment of the present invention.

In step S1010 of FIG. 4, through reactive ion etching (RIE) in an atmosphere of a first gas, fine roughness having the average pitch of a desired value is formed on a surface of the plastic element 200. FIG. 5A shows the plastic element 200 that has not undergone step S1010, and FIG. 5B shows the plastic element 200 that has undergone step S1010.

In step S1020 of FIG. 4, through reactive ion etching (RIE) in a second gas atmosphere reactivity of which is lower than reactivity of the first gas, a desired value of the average depth of the fine roughness is obtained while the desired value of the average pitch of the fine roughness is kept unchanged. FIG. 5C shows the plastic element 200 that has undergone step S1020.

When wavelength of a ray of light, refractive index of a plastic element and angle of incidence of the ray of light are represented respectively by λ, n and θ, a target value P of average pitch of fine roughness for anti-reflection should be determined such that the following relationship is satisfied.

$$P < \frac{\lambda}{n + \sin\theta}$$

When wavelength of a ray of light, refractive index of the plastic element and angle of incidence of the ray of light are respectively λ=0.4 μm, n=1.5 and θ=30°, the target value P should be less than 0.2 μm. In general, a target value of average depth of the fine roughness for anti-reflection should be at least 0.35 times as great as wavelength of a ray of light. The value of average depth is approximately 0.25 μm or more for the maximum wavelength 0.7 μm of visible light.

FIG. 6 is a flowchart for describing how to determine the etching conditions of the first step.

In step S2010 of FIG. 6, reactive ion etching (RIE) is performed under predetermined conditions in an atmosphere of a first gas.

In step S2020 of FIG. 6, fine roughness that has been generated is observed to determine whether or not the average pitch is at a desired value, that is a target value. When the average pitch is at a desired value, the process is terminated. When the average pitch is not at a desired one, the process goes to S2030.

In step S2030 of FIG. 6, at least one of set values of power and time is adjusted so as to obtain the desired value of average pitch of the fine roughness. In order to increase the average pitch, at least one of set values of power and time should be increased. In order to decrease the average pitch, at least one of set values of power and time should be decreased. After step S2030 has been completed, the process returns to step S2010.

Figure 7:
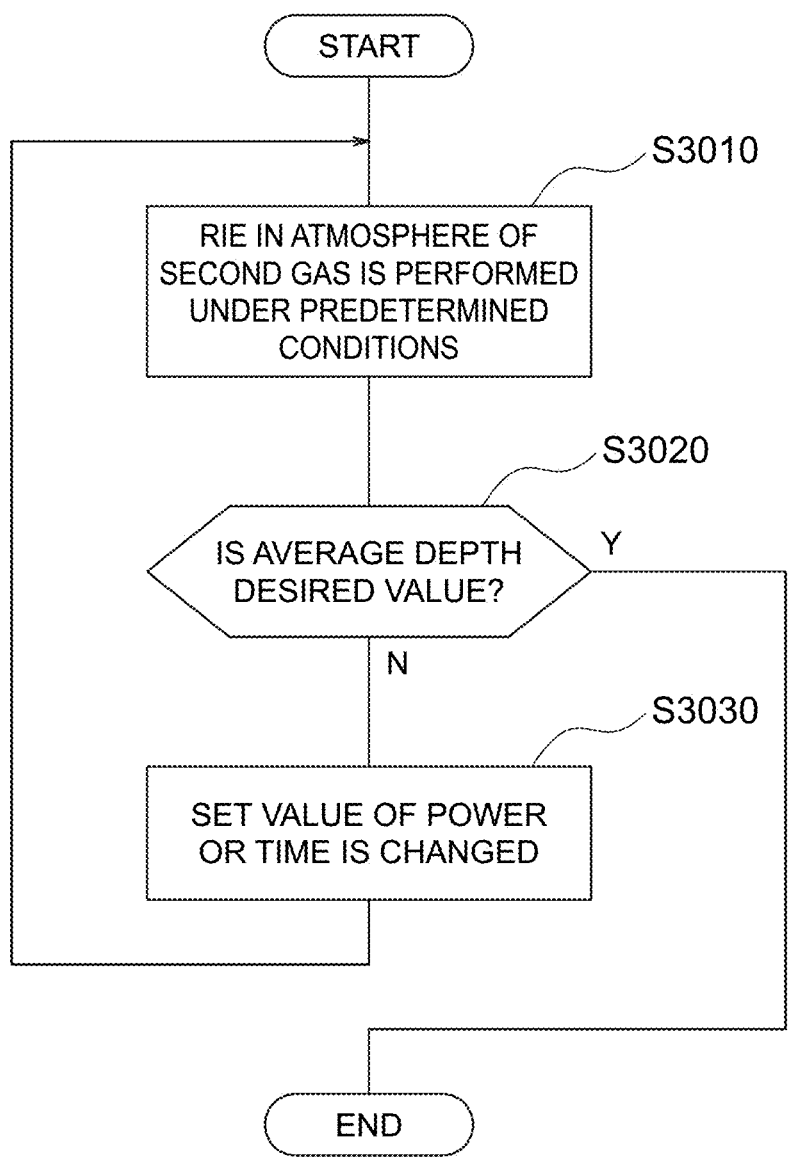
FIG. 7 is a flowchart for describing how to determine the etching conditions of the second step.

FIG. 7 is a flowchart for describing how to determine the etching conditions of the second step. After the first step has been performed under the etching conditions determined by the method shown in FIG. 6, the etching conditions of the second step are determined by the method shown in the flowchart of FIG. 7.

In step S3010 of FIG. 7, reactive ion etching (RIE) is performed under predetermined conditions in an atmosphere of a second gas.

In step S3020 of FIG. 7, the fine roughness that has been generated is observed to determine whether or not the average pitch is at a desired one, that is a target value. When the average pitch is at a desired one, the process is terminated. When the average pitch is not at a desired one, the process goes to S3030.

In step S3030 of FIG. 7, at least one of set values of power and time is adjusted so as to obtain a desired value of the average pitch of the fine roughness. In order to increase the average pitch, at least one of set values of power and time should be increased. In order to decrease the average pitch, at least one of set values of power and time should be decreased. After step S3030 has been completed, the process returns to step S3010.

Figure 8:
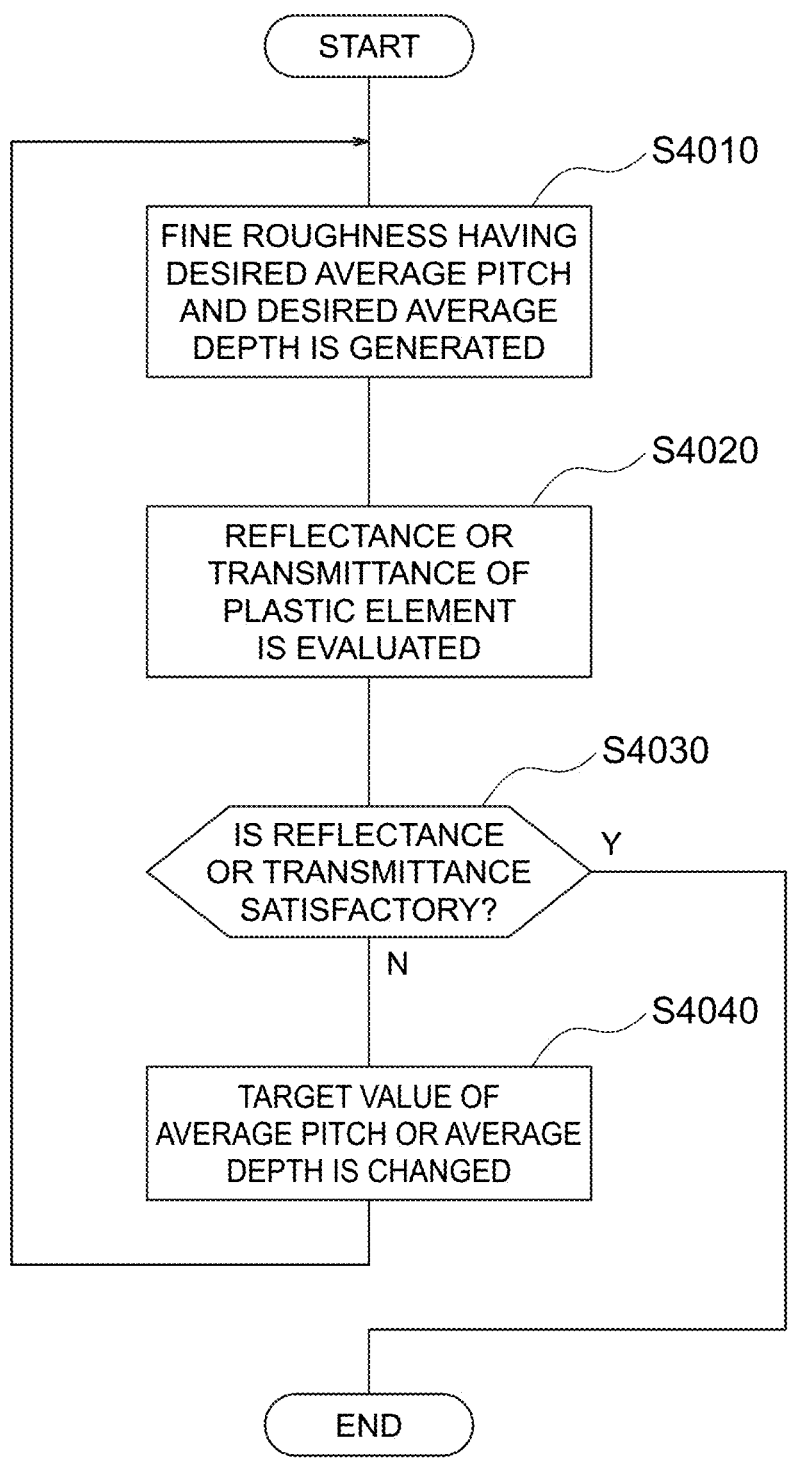
FIG. 8 is a flowchart for describing how to adjust target values of average pitch and average depth of fine roughness.

FIG. 8 is a flowchart for describing how to adjust target values of average pitch and average depth of the fine roughness.

In step S4010 of FIG. 8, the fine roughness having the average pitch of a desired value and the average depth a desired value is generated by the methods shown in the flowcharts of FIG. 6 and FIG. 7.

In step S4020 of FIG. 8, reflectance and transmittance of the plastic element are estimated.

In step S4030 of FIG. 8, it is determined whether or not the reflectance and transmittance of the plastic element are satisfactory. If satisfactory, the process is terminated. If not satisfactory, the process goes to step S4040.

In step S4040 of FIG. 8, at least one of the target value of average pitch and the target value of average depth is changed. After step S4040 has been completed, the process returns to S4010.

Table 2 shows etching conditions of an etching method according to an embodiment of the present invention and the average pitch and the average depth of the fine roughness generated by the etching method. The plastic element 200 is made of polycarbonate.

average pitch is kept at 0.06 µm. Thus, fine roughness having the average pitch and the average depth that are appropriate to anti-reflection of visible light can be obtained.

Figure 9:
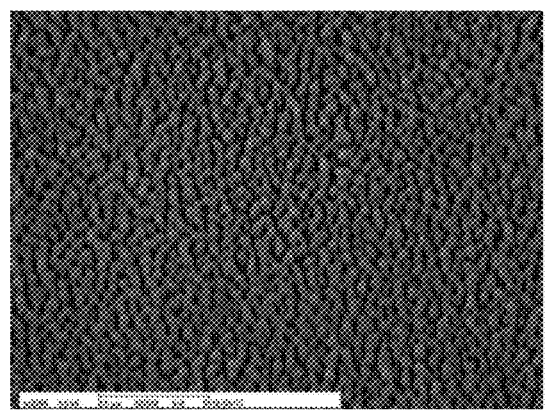
FIG. 9 is a SEM image of the fine roughness for anti-reflection of visible light generated by the method shown in Table 2.

FIG. 9 is a SEM image of the fine roughness for anti-reflection of visible light generated by the method shown in Table 2. As shown in Table 2, the average pitch is 0.06 µm and the average depth is 0.3 µm.

Figure 10:
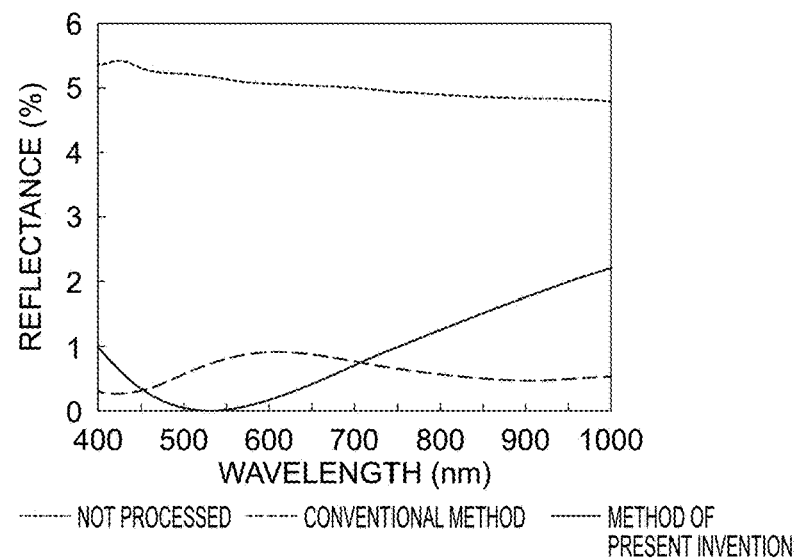
FIG. 10 shows relationships between wavelength and reflectance.

FIG. 10 shows relationships between wavelength and reflectance. The horizontal axis of FIG. 10 indicates wavelength, and the vertical axis of FIG. 10 indicates reflectance. The solid line represents reflectance of a plastic element provided with the fine roughness obtained by the method of the present invention shown in Table 2. The broken line described as "conventional method" represents reflectance of a plastic element provided with the fine roughness obtained by the method shown in Table 1 as conditions 2. The dotted line described as "not processed" represents reflectance of a plastic element without fine roughness.

Figure 11:
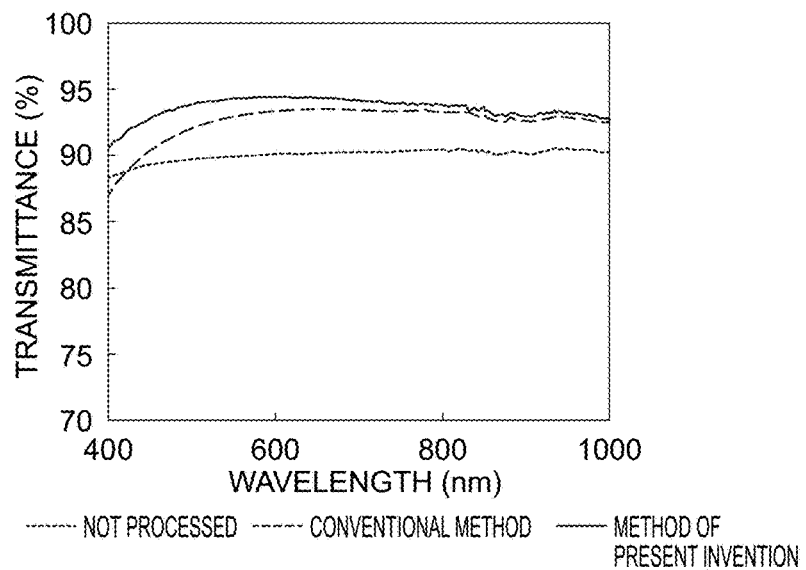
FIG. 11 shows relationships between wavelength and transmittance.

FIG. 11 shows relationships between wavelength and transmittance. The horizontal axis of FIG. 11 indicates wavelength, and the vertical axis of FIG. 11 indicates transmittance. The solid line represents transmittance of a plastic element provided with the fine roughness obtained by the method of the present invention shown in Table 2. The broken line described as "conventional method" represents transmittance of a plastic element provided with the fine roughness obtained by the method shown in Table 1 as conditions 2. The dotted line described as "not processed" represents transmittance of a plastic element without fine roughness.

The measurements of reflectance shown in FIG. 10 and those of transmittance shown in FIG. 11 are those of a plastic element in the shape of a flat sheet having a thickness of 5 mm.

According to FIG. 10, the values of reflectance of the plastic element provided with the fine roughness obtained by the method according to the present invention is 1 percent or smaller in the range of visible light from 400 nanometers to 700 nanometers and smaller than the values of reflectance of the plastic element provided with the fine roughness obtained by the method shown in Table 1 as conditions 2.

According to FIG. 11, the values of transmittance of the plastic element provided with the fine roughness obtained by the method according to the present invention is 90 percent or greater in the range of visible light from 400 nanometers to 700 nanometers, and greater than the values of transmittance of the plastic element provided with the fine roughness obtained by the method shown in Table 1 as conditions 2.

TABLE 2

|  | Gas pressure | Kind and flow rate of gas | RF power | Processing temperature | Processing time | Average pitch | Average depth |
|---|---|---|---|---|---|---|---|
| First step | 0.5 Pa | O2:5 ml/min SF6:20 ml/min | 100 W | 30° C. | 250 sec | 0.06 µm | 0.1 µm |
| Second step | 1.0 Pa | O2:2 ml/min CHF3:60 ml/min | 100 W | 30° C. | 650 sec |  | 0.3 µm |

A first gas that is an atmosphere gas in the first step is a mixture of oxygen gas and sulfur hexafluoride ($SF_6$) gas. A second gas that is an atmosphere gas in the second step is a mixture of oxygen gas and trifluoromethane ($CHF_3$) gas. Reactivity to the plastic element of the second gas is lower than reactivity to the plastic element of the first gas. After the first step has been completed, the average pitch is 0.06 µm and the average depth is 0.1 µm. In the second step the average depth increases from 0.1 µm to 0.3 µm, and the Further, the values of transmittance of the plastic element provided with the fine roughness obtained by the method according to the present invention is greater by approximately 5 percent than the plastic element without fine roughness in the range of visible light from 400 nanometers to 700 nanometers.

Etching in an atmosphere that consists of a single kind of gas will be described below.

Table 3 shows etching conditions of etching in an atmosphere of a single kind of gas and average values of pitch and depth of fine roughness generated by the etching. The plastic element is made of polycarbonate.

TABLE 3

|  | Gas pressure | Kind and flow rate of gas | RF power | Processing temperature | Processing time | Average pitch | Average depth |
| --- | --- | --- | --- | --- | --- | --- | --- |
| CHF3 | 0.5 Pa | CHF3:20 ml/min | 100 W | 30° C. | 900 sec | 0.05 μm | 0.02 μm |
| SF6 | 0.5 Pa | SF6:20 ml/min | 100 W | 30° C. | 900 sec | 0.20 μm | 0.3 μm |
| O2 | 0.5 Pa | O2:20 ml/min | 100 W | 30° C. | 900 sec | (No roughness) | (No roughness) |

Figure 12:
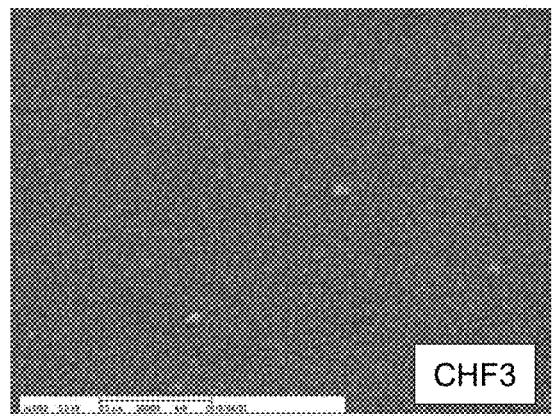
FIG. 12 is a SEM image of a surface of the plastic element obtained after etching in a gas atmosphere of trifluoromethane ($CHF_3$) alone.

FIG. 12 is a SEM image of a surface of the plastic element obtained after the processing in a gas atmosphere of trifluoromethane ($CHF_3$) alone.

Figure 13:
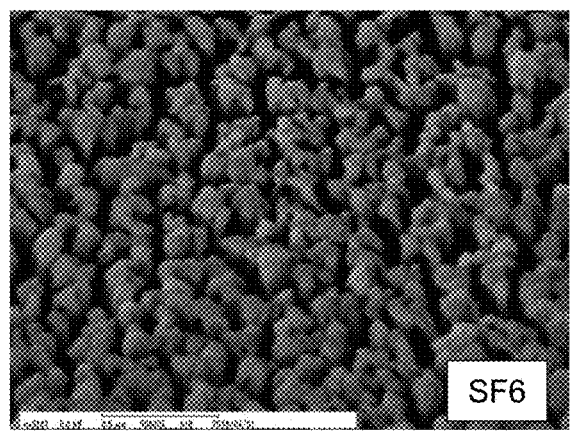
FIG. 13 is a SEM image of a surface of the plastic element obtained after etching in a gas atmosphere of sulfur hexafluoride ($SF_6$) alone.

FIG. 13 is a SEM image of a surface of the plastic element obtained after the processing in a gas atmosphere of sulfur hexafluoride ($SF_6$) alone.

Figure 14:
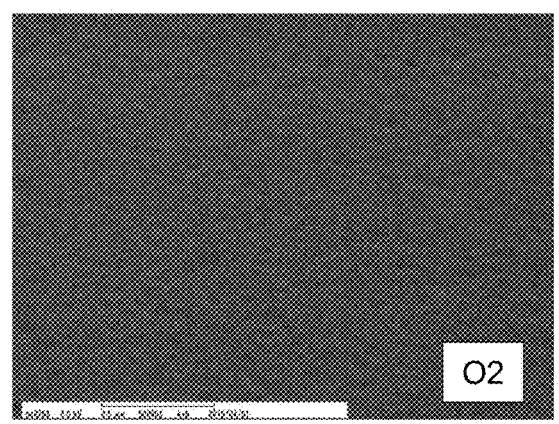
FIG. 14 is a SEM image of a surface of the plastic element obtained after etching in a gas atmosphere of oxygen ($O_2$) alone.

FIG. 14 is a SEM image of a surface of the plastic element obtained after the processing in a gas atmosphere of oxygen ($O_2$) alone.

The average pitch of the fine roughness generated after the processing in a gas atmosphere of sulfur hexafluoride alone is greater than the average pitch of the fine roughness generated after the processing in a gas atmosphere of trifluoromethane alone. The average depth of the fine roughness generated after the processing in a gas atmosphere of sulfur hexafluoride alone is greater than the average depth of the fine roughness generated after the processing in a gas atmosphere of trifluoromethane alone. Accordingly, it can be understood that reactivity of sulfur hexafluoride to a plastic element of polycarbonate is higher than reactivity of trifluoromethan to a plastic element of polycarbonate.

According to FIG. 14, on the surface of the plastic element fine roughness has not been generated after the processing in a gas atmosphere of oxygen alone.

Figure 15:
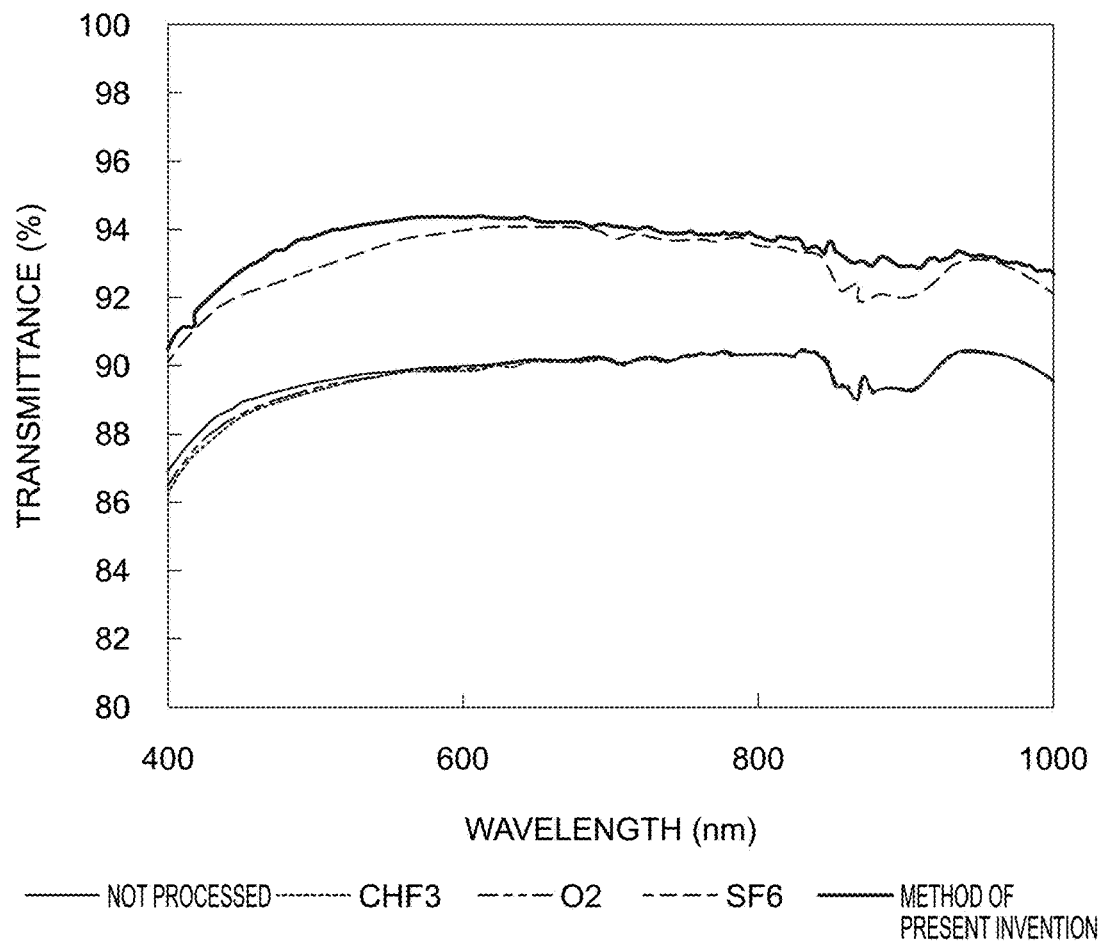
FIG. 15 shows relationships between wavelength and transmittance.

FIG. 15 shows relationships between wavelength and transmittance. The horizontal axis of FIG. 15 indicates wavelength, and the vertical axis of FIG. 15 indicates transmittance. The thick solid line represents transmittance of the plastic element provided with the fine roughness obtained by a method according to the present invention, and the method is shown in Table 2. The broken line represents transmittance of the plastic element provided with the fine roughness obtained after the processing in a gas atmosphere of sulfur hexafluoride ($SF_6$) alone shown in Table 3. The dotted line represents transmittance of the plastic element provided with the fine roughness obtained after the processing in a gas atmosphere of trifluoromethane ($CHF_3$) alone shown in Table 3. The two-dot chain line represents transmittance of the plastic element provided with the fine roughness obtained after the processing in in a gas atmosphere of oxygen ($O_2$) alone shown in Table 3. The thin solid line described as "not processed" represents transmittance of a plastic element that has not been processed and is not provided with fine roughness.

According to FIG. 15, the transmittance of the plastic element provided with the fine roughness obtained after the processing in a gas atmosphere of trifluoromethane ($CHF_3$) alone and the transmittance of the plastic element provided with the fine roughness obtained after the processing in in a gas atmosphere of oxygen ($O_2$) alone are substantially equal to the transmittance of a plastic element that has not been processed and is not provided with fine roughness, and approximately by 4% to 5% smaller than the transmittance of the plastic element provided with the fine roughness obtained by the method according to the present invention in the range of visible light from 400 nanometers to 700 nanometers. The plastic element provided with the fine roughness obtained after the processing in a gas atmosphere of sulfur hexafluoride ($SF_6$) alone is at the maximum by approximately 1% smaller than the transmittance of the plastic element provided with the fine roughness obtained by the method according to the present invention in the range in which wavelength is 600 nanometers or smaller.

The above description concerns plastic elements made of polycarbonate. The present invention is also applicable to elements made of other plastic materials. Examples in which the plastic material is acryl resin will be described below.

Table 4 shows etching conditions of an etching method according to another embodiment of the present invention and average values of pitch and depth of the fine roughness generated by the etching method. The plastic element 200 is made of polymethyl methacrylate (PMMA) that is a species of acryl resin.

TABLE 4

|  | Gas pressure | Kind and flow rate of gas | RF power | Processing temperature | Processing time | Average pitch | Average depth |
| --- | --- | --- | --- | --- | --- | --- | --- |
| First step | 0.5 Pa | Ar:15 ml/min SF6:20 ml/min | 75 W | 10° C. | 250 sec | 0.06 μm | 0.1 μm |
| Second step | 1.0 Pa | Ar:2 ml/min CHF3:20 ml/min | 100 W | 10° C. | 600 sec |  | 0.3 μm |

Figure 16:
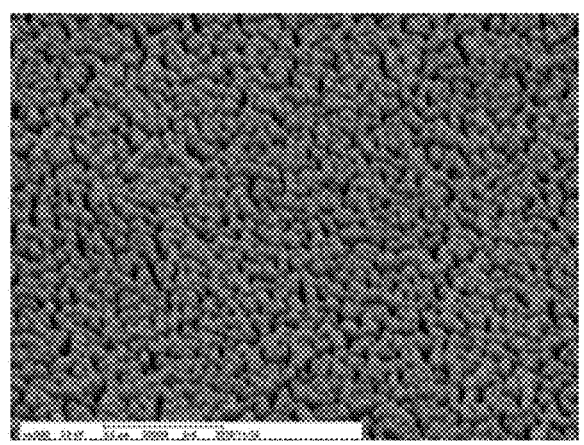
FIG. 16 is a SEM image of the fine roughness for anti-reflection of visible light generated by the method shown in Table 4.

FIG. 16 is a SEM image of the fine roughness for anti-reflection of visible light generated by the method shown in Table 4.

Figure 17:
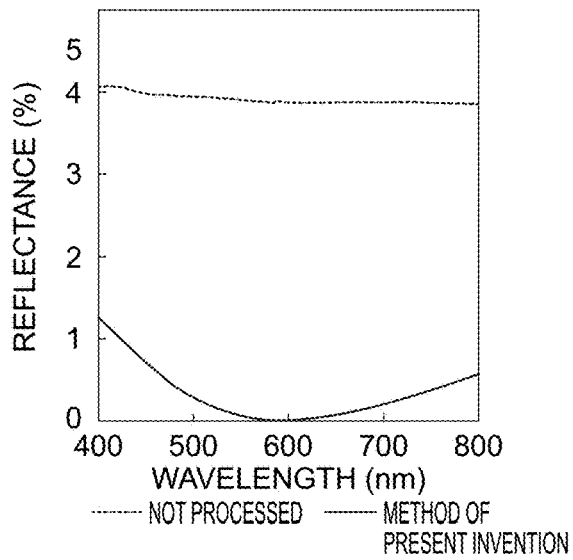
FIG. 17 shows relationships between wavelength and reflectance.

FIG. 17 shows relationships between wavelength and reflectance. The horizontal axis of FIG. 17 indicates wavelength, and the vertical axis of FIG. 17 indicates reflectance. The solid line represents reflectance of a plastic element provided with the fine roughness obtained by the method of the present invention shown in Table 4. The dotted line described as "not processed" represents reflectance of a plastic element without fine roughness.

Figure 18:
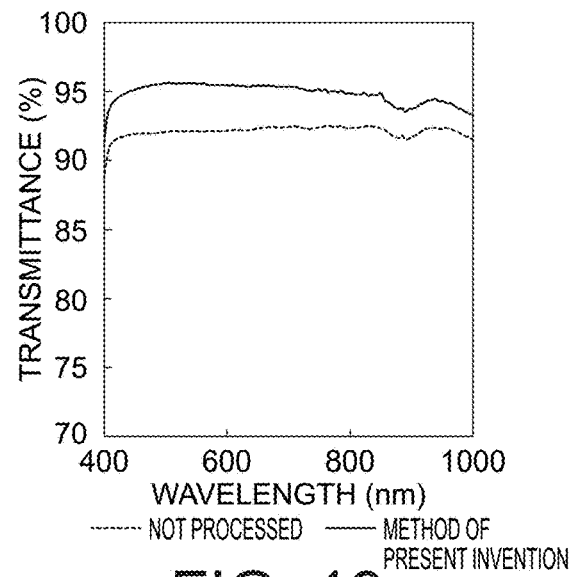
FIG. 18 shows relationships between wavelength and transmittance.

FIG. 18 shows relationships between wavelength and transmittance. The horizontal axis of FIG. 18 indicates wavelength, and the vertical axis of FIG. 18 indicates transmittance. The solid line represents transmittance of a plastic element provided with the fine roughness obtained by the method of the present invention shown in Table 4. The dotted line described as "not processed" represents transmittance of the plastic element without fine roughness.

According to FIG. 18, the values of transmittance of the plastic element provided with the fine roughness obtained by the method according to the present invention is 92 percent or greater in the range of visible light from 400 nanometers to 700 nanometers, and greater by approximately 3 to 4 percent than those of the plastic element without fine roughness.

Table 5 shows etching conditions of an etching method according to another embodiment of the present invention and the average pitch and the average depth of the fine roughness generated by the etching method. The plastic element 200 is made of polymethyl methacrylate (PMMA).

TABLE 5

| | Gas pressure | Kind and flow rate of gas | RF power | Processing temperature | Processing time | Average pitch | Average depth |
|---|---|---|---|---|---|---|---|
| First step | 0.5 Pa | O2:20 ml/min | 53 W | 10° C. | 250 sec | 0.06 μm | 0.1 μm |
| Second step | 1.0 Pa | Ar:15 ml/min CHF3:20 ml/min | 100 W | 10° C. | 600 sec | | 0.3 μm |

The fact that in the present embodiment fine roughness having the average pitch of a desired value and the average depth of a desired value has been obtained by the use of oxygen gas in the first step and a mixed gas of trifluoromethane and argon in the second step is indicative of that reactivity to polymethyl methacrylate of oxygen gas is higher than reactivity to polymethyl methacrylate of the mixed gas of trifluoromethane and argon.

When etching was continued in an oxygen gas atmosphere after the first step has been completed, the average depth did not change remarkably and the average pitch increased, and the desired value of the average pitch and the desired value of the average depth have not been obtained.

The reason why fine roughness has not been generated after etching of polycarbonate in an atmosphere of oxygen gas alone is considered to be not that etching has not been performed but that uniform etching has been performed because of the power and the long etching time. In general, it is considered that oxygen, sulfur hexafluoride and trifluoromethane can be listed in order of decreasing reactivity to plastic materials. As a gas reactivity of which to plastic materials is relatively low, carbon tetrafluoride ($CF_4$) can be used instead of trifluoromethane.

Alternatives of the atmosphere gas in the first step in an etching method according to an embodiment of the present invention include hexafluoride, a mixture of hexafluoride and at least one of oxygen and argon, and oxygene. Alternatives of the atmosphere gas in the second step in an etching method according to an embodiment of the present invention include trifluoromethane, a mixture of trifluoromethane and at least one of oxygen and argon, carbon tetrafluoride, and a mixture of carbon tetrafluoride and at least one of oxygen and argon.

In the present invention, after the average pitch of fine roughness has been determined in the first step, in the second step, the average depth can be increased while the average pitch is maintained through a process performed in an atmosphere gas, reactivity to a plastic element of the atmosphere gas being lower than reactivity to the plastic element of the atmosphere gas in the first step. Thus, by the present invention a plastic element provided with fine roughness having a desired value of pitch and a desired value of depth can be produced.

A new method for water-repellent finishing of a plastic element provided with fine roughness will be described below. Conventionally, for water-repellent finishing of a plastic element provided with fine roughness, the element is dipped into a water-repellent coating liquid to coat the surface of the element with a water-repellent film. It is difficult, however, to coat fine surface roughness of a complicatedly shaped lens with a uniform water-repellent film. Further, the process requires a lot of time and effort, and water-repellent coating liquids are very expensive. Accordingly, costs for the process are high.

In a new method for water-repellent finishing, water-repellent finishing of fine surface roughness of a plastic element is performed using an apparatus having a structure similar to that of the reactive ion etching apparatus 100A shown in FIG. 1.

Figure 19:
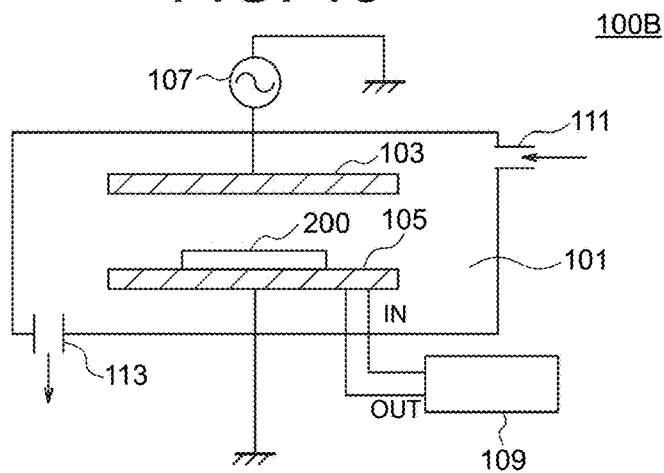
FIG. 19 shows a configuration of an apparatus for water-repellent finishing used for a water-repellent finishing method according to an embodiment of the present invention.

FIG. 19 shows a configuration of an apparatus for water-repellent finishing 100B used for a water-repellent finishing method according to an embodiment of the present invention. The apparatus for water-repellent finishing 100B includes a reaction chamber 101. Gas is supplied form a gas supply port 111 into the evacuated reaction chamber 101. An amount of gas to be supplied can be adjusted. Further, the reaction chamber 101 is provided with a gas exhaust port 113, which is provided with a valve that is not shown in the drawing. Pressure in the reaction chamber 101 can be kept at a desired value through control of the valve. The reaction chamber 101 is provided with a lower electrode 105, which is grounded and an upper electrode 103 which is connected to a high frequency power supply 107. Plasma can be generated by applying high frequency voltage between the both electrodes using the high-frequency power supply 107. On the lower electrode 105, a plastic element 200 provided with fine surface roughness is placed. The plastic element 200 is a plastic lens, for example. The lower electrode 105 can be cooled down to a desired temperature using a coiling device 109. The coiling device 109 is of a water chiller type, for example. The reason why the lower electrode 105 is cooled down is to control etching reaction by keeping the plastic element 200 at a desired temperature.

The reactive ion etching apparatus 100A shown in FIG. 1 and the apparatus for water-repellent finishing 100B shown in FIG. 19 are different from each other only in the connection of the high frequency power supply 107 to one of the upper and lower electrodes. In the apparatus for water-repellent finishing 100B, the lower electrode 105, on which the plastic element 200 provided with fine surface roughness is placed, is grounded so that ions do not cause etching. In the apparatus for water-repellent finishing 100B, a water-repellent finishing process is performed by making fluorinated radicals generated through plasma adhere to the surface of the fine surface roughness. An atmosphere gas is selected, and power of the high frequency power supply and processing time are adjusted to prevent the radicals from destructing the fine roughness. An etching process and a water-repellent finishing process can be performed using a single apparatus that is configured in such a way that the high frequency power supply can be selectively connected to one of the upper and lower electrodes.

Table 6 shows conditions of the water-repellent finishing process. The plastic element 200 is made of polymethyl methacrylate (PMMA).

TABLE 6

|  | Gas pressure | Kind and flow rate of gas | RF power | Processing temperature | Processing time |
|---|---|---|---|---|---|
| Conditions 1 | 5 Pa | CHF3:50 mL/min | 100 W | 10° C. | 300 sec |
| Conditions 2 | 1 Pa | CHF3:50 mL/min | 50 W | 10° C. | 300 sec |

As an atmosphere gas for the water-repellent finishing process, carbon tetrafluoride or sulfur hexafluoride can be used instead of trifluoromethane.

Figure 20:
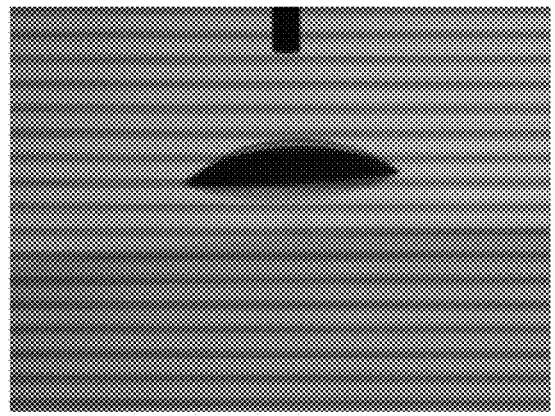
FIG. 20 is an image of a drop of water formed on a surface of a plastic element provided with fine roughness that has not undergone water-repellent finishing.

FIG. 20 is an image of a drop of water formed on a surface of a plastic element provided with fine roughness that has not undergone a water-repellent finishing process. The angle of contact that is an angle formed by a tangential line on the surface of the drop of water and the surface of the plastic element in a cross-section perpendicular to the surface of the plastic element is 38.3 degrees.

Figure 21:
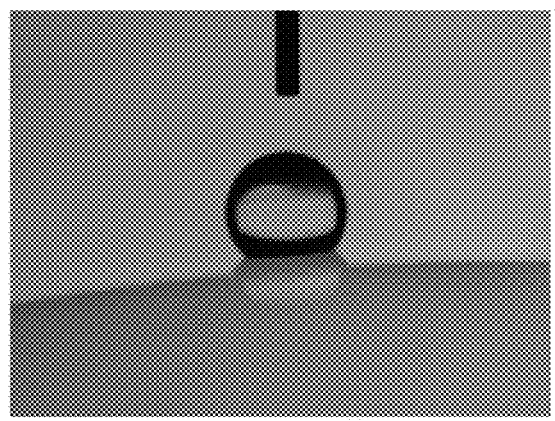
FIG. 21 is an image of a drop of water formed on a surface of a plastic element provided with fine roughness that has undergone water-repellent finishing under the conditions-set 1 in Table 6.

FIG. 21 is an image of a drop of water formed on a surface of a plastic element provided with fine roughness that has undergone a water-repellent finishing process under the conditions-set 1 in Table 6. The angle of contact is 139 degrees. The angle of contact has remarkable increased by the water-repellent finishing process.

Figure 22:
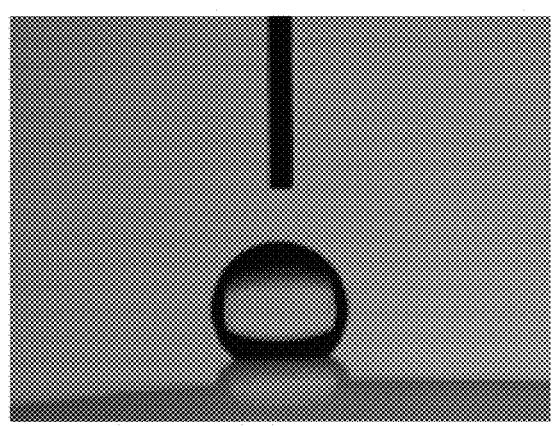
FIG. 22 is an image of a drop of water formed on a surface of a plastic element provided with fine roughness that has undergone water-repellent finishing under the conditions-set 2 in Table 6.

FIG. 22 is an image of a drop of water formed on a surface of a plastic element provided with fine roughness that has undergone a water-repellent finishing process under the conditions-set 2 in Table 6. The angle of contact is 137 degrees. The angle of contact has remarkable increased by the water-repellent finishing process.

What is claimed is:

1. A method for producing a plastic element provided with fine surface roughness through two separate consecutive steps, comprising:
   in a first step, fine roughness having a predetermined average value of pitch in a range from 0.05 micrometers to 1 micrometer is generated on a surface of the plastic element through reactive ion etching in an atmosphere of a first gas; and
   in a second step, an average value of depth of the same fine roughness generated in the first step is made to increase up to a predetermined value in a range from 0.15 micrometers to 1.5 micrometers while the predetermined average value of pitch of the same fine roughness is substantially maintained through reactive ion etching in an atmosphere of a second gas, reactivity to the plastic element of the second gas being lower than reactivity to the plastic element of the first gas.

2. The method for producing a plastic element provided with fine surface roughness according to claim 1, wherein the first gas is sulfur hexafluoride ($SF_6$), a mixture of sulfur hexafluoride and at least one of oxygen ($O_2$) and argon (Ar), or oxygen.

3. The method for producing a plastic element provided with fine surface roughness according to claim 1, wherein the second gas used in the second step is trifluoromethane ($CHF_3$), a mixture of trifluoromethane and at least one of oxygen ($O_2$) and argon (Ar), carbon tetrafluoride ($CF_4$), or a mixture of carbon tetrafluoride and at least one of oxygen and argon.

4. The method for producing a plastic element provided with fine surface roughness according to claim 1, further comprising a third step in which through plasma processing in an atmosphere of a third gas, fluorinated radicals are made to adhere to the surface of the fine roughness while ions are prevented from causing etching.

5. The method for producing a plastic element provided with fine surface roughness according to claim 4, wherein the third gas is trifluoromethane, carbon tetrafluoride or sulfur hexafluoride.

6. The method for producing a plastic element provided with fine surface roughness according to claim 1, wherein the plastic element is an optical element.

7. The method for producing a plastic element provided with fine surface roughness according to claim 1, wherein the fine roughness is fine roughness for anti-reflection.

* * * * *